United States Patent [19]
Ternes

[11] Patent Number: 5,205,039
[45] Date of Patent: Apr. 27, 1993

[54] METHOD FOR REGISTERING MULTIPLE PRINTING PLATES

[76] Inventor: James Ternes, 2361 W. Hwy. 36, St. Paul, Minn. 55113

[21] Appl. No.: 791,340

[22] Filed: Nov. 14, 1991

[51] Int. Cl.⁵ ............................................. B23P 17/00
[52] U.S. Cl. .............................. 29/895.21; 29/895.23; 29/895.3; 29/414; 101/DIG. 36
[58] Field of Search ............. 29/895.2, 895.21, 895.23, 29/895.3, 412, 413, 414; 101/463.1, DIG. 36

[56] References Cited

U.S. PATENT DOCUMENTS

| | | | |
|---|---|---|---|
| 3,254,396 | 6/1966 | Mushey | 29/413 |
| 4,333,221 | 6/1982 | Hayashi | 29/413 |

FOREIGN PATENT DOCUMENTS

| | | | |
|---|---|---|---|
| 675749 | 12/1963 | Canada | 101/DIG. 36 |
| 3129418 | 3/1983 | Fed. Rep. of Germany | 101/DIG. 36 |
| 1234761 | 6/1971 | United Kingdom | 101/DIG. 36 |

Primary Examiner—P. W. Echols
Assistant Examiner—David P. Bryant
Attorney, Agent, or Firm—Douglas L. Tschida

[57] ABSTRACT

A method for aligning multiple printing plates on a single piece of printing plate stock, whereby all plates register to one another and one or more printing press cylinders. The method includes the steps of (1) punching image and cylinder registration indices on the stock; (2) imaging a plurality of regions on the stock defining separate printing plates; (3) forming slitting indices relative to the defined plate regions; (4) forming a cylinder registration bend along at least one edge of the stock; and (5) slitting the stock into a plurality of printing plates. In one process, elongated image registration apertures, cylinder registration bends and notches and V-shaped slitting notches are successively provided to all plate regions to assure alignment of the printing plates to each other and the press cylinders.

12 Claims, 7 Drawing Sheets

METHOD FOR REGISTERING MULTIPLE PRINTING PLATES

BACKGROUND OF THE INVENTION

The present invention relates to a method and apparatus for creating printing plates and, in particular, to the creation of multiple, simultaneously aligned plates from a single piece of printing plate stock.

Traditional methods for creating printing plates require plate makers to inventory a variety of widths and lengths of plate stock material. The specific stock sizes inventoried depend upon the width and circumference of each customer's press cylinder. Adjustments to accommodate different cylinder sizes and specific print runs compound the inventory dilemma and, more often than not, result in unusable plate stock.

Depending on the press run, the plates are typically formed from a single piece of plate stock. That is, the stock is cut into a number of separate plates of appropriate width and length to accommodate the press run. The presized plates are next separately punched to create a number of image and drum registration indices (i.e. apertures or partial apertures) which permit the alignment of the individual plates with the press cylinder and photographic equipment used to reproduce desired printing images onto the plates. At least the lead edge of each imaged plate is next formed or bent to mate with the "nose" of the cylinder and cylinder registration indices. A lockup assembly may be included with the cylinder to retain a bent portion of the tail edge of each plate to the cylinder in combination with centrifugal force.

Although generally effective in practice, the above plate preparation method produces a compounding of tolerance differentials and forming errors which can cause misalignment at the press. Not until the prepared plates are reassembled with respect to the press cylinder and the images are transferred to paper do the compounded errors become apparent. Then, the accrued error can necessitate extensive time to reset the press and re-align the plates. Overall print costs to the end-customer are thereby increased.

In appreciation of the foregoing deficiencies, Applicant has developed a method for simultaneously preparing multiple plates from a single piece of plate stock containing multiple plate images. All plates are imaged in registry to each other and the press cylinder, prior to cutting the individual plates from the stock. Plate processing time, plate stock inventory, press setup time and paper stock waste are thereby minimized.

SUMMARY OF THE INVENTION

It is accordingly a primary object of the present invention to provide a method for simultaneously creating multiple printing plates from a single piece of printing plate stock.

It is a further object of the invention to simultaneously image or print a plurality of plates onto a single piece of plate stock in predetermined relation to a single set of imaging registration marks.

It is a further object of the invention to provide a method for forming a set of cylinder registration indices into a single piece of plate stock in predetermined relation to multiple print images.

It is a further object of the invention, after imaging, to simultaneously provide a plurality of registered dicing or slitting indices into a the plate stock in alignment with the plurality of printed images and prior to registering the plate to the press cylinder.

It is a still further object of the invention to slit each of the plurality of imaged plates from the prepared plate stock relative to V-shaped slitting indices, after one or more cylinder registration bends have been formed.

Various of the foregoing objects, advantages and distinctions of the invention are obtained in one preferred methodology including the following steps. Preparing a printing plate substrate to include means for registering the plate stock to photo reproducing means and a press cylinder. Imaging the plate with a plurality of print images produced from a plurality of individually aligned images or a single multiple image layout. Trimming a tail edge of the plate stock, if required. Preparing a plurality of V-shaped notches or dicing indices along peripheral plate edges in alignment with the printed images. Bending at least one peripheral plate edge aligned to all contained images and an intended press cylinder. Cutting the imaged plate stock into a plurality of printing plates. And, mounting the simultaneously prepared plates to one or more printing press cylinders compatible with the prepared plates and one or more webs of paper stock to be printed.

Still other objects, advantages and distinctions of the invention will become more apparent hereinafter, upon reference to the following description with respect to the appended drawings. The description is intended to be illustrative only of presently considered constructions of the invention, modifications and improvements thereto. It should not be strictly construed. The invention otherwise should be interpreted within the scope of the appended claims.

DESCRIPTION OF THE PREFERRED EMBODIMENT

Figure 1:
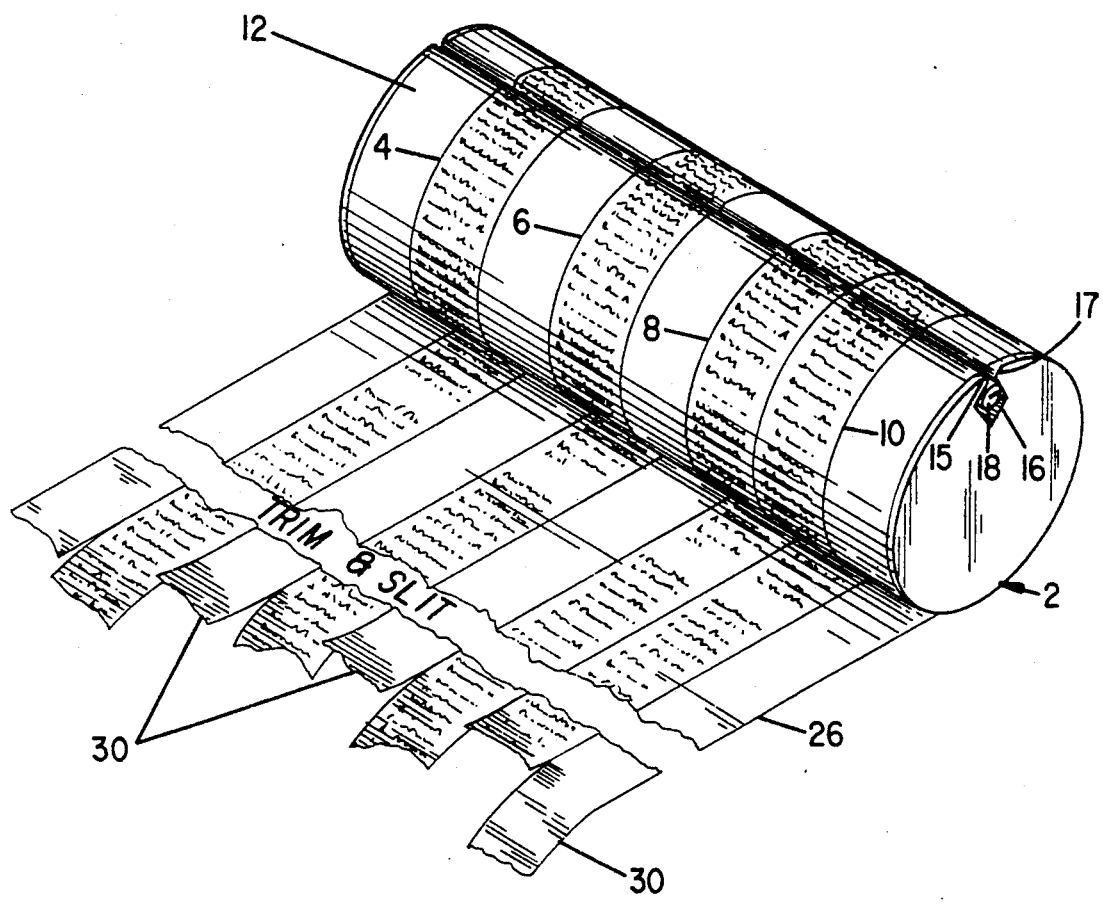
FIG. 1 is a perspective drawing of a typical printing press cylinder including a plurality of spaced apart printing plates secured thereto and in relation to a web of paper stock.
Figure 2:
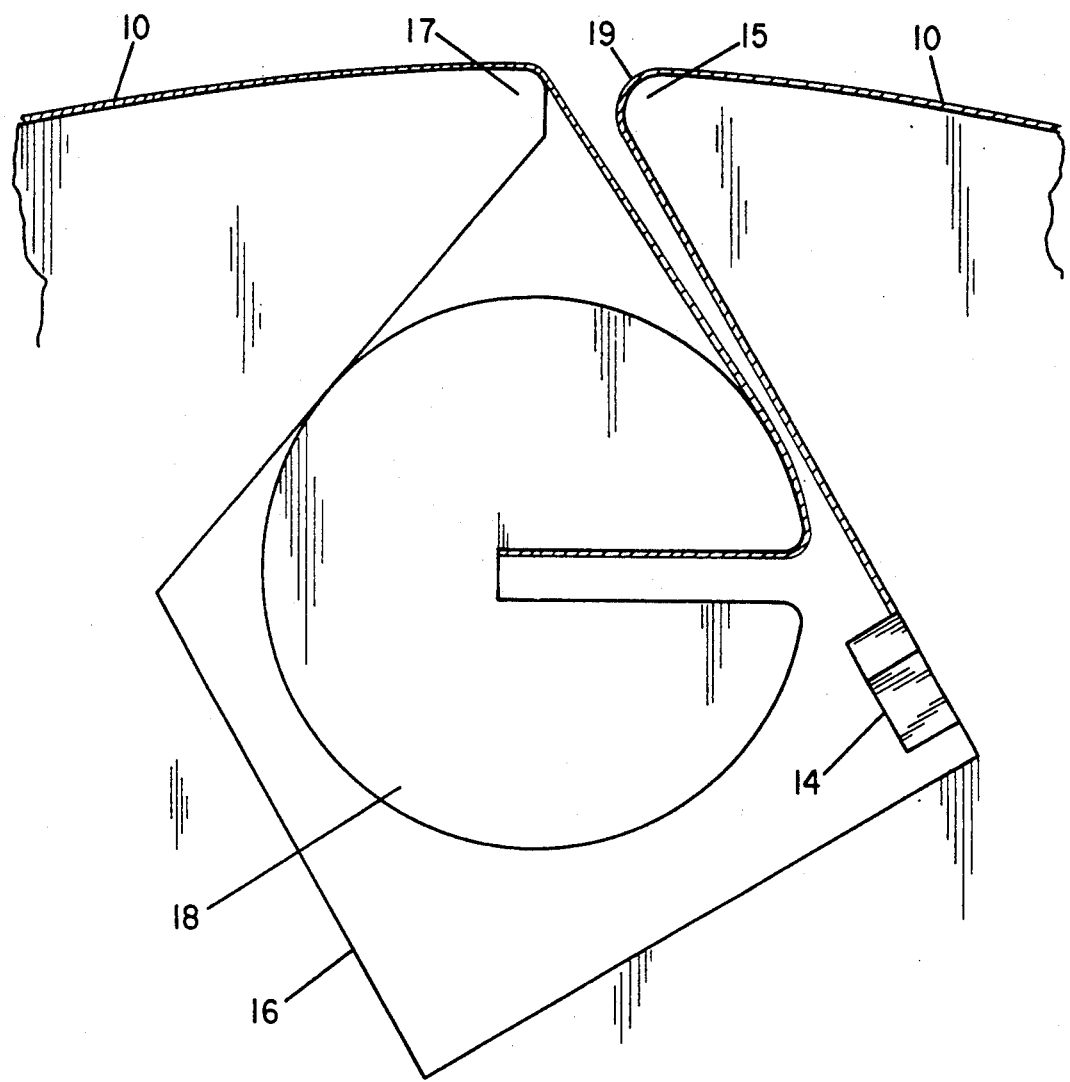
FIG. 2 is a detailed elevation drawing showing the mounting of a printing plate to the cylinder nose and a lockup assembly.

FIG. 1 depicts a perspective drawing of a typical printing press cylinder 2 and exemplary mountings of multiple printing plates 4, 6, 8 and 10 to the cylinder printing surface 12. Although a single cylinder 2 is shown, it is to be appreciated multiple cylinders 2, each containing a set of plates registered to the plates of a succeeding or following cylinder 2, are typically arranged along the length of a press. Referring also to FIG. 2, the plates are aligned to the cylinder 2 with the aid of press registration pins 14 which are positioned adjacent the nose or leading edge 15 of the cylinder and along a longitudinal channel 16. A preformed bend 19 at the leading edge of each plate in combination with the registration pins 14 and mating notches formed in the plates, define the alignment of the plates to the cylinder.

If the cylinders do not include registration pins, registration is obtained via the bends 19.

A trailing cylinder edge 17 receives the trailing edge of the plates, which for the cylinder depicted are also retained in a "lockup" assembly 18. The lockup assembly mounts in the channel 16 and extends the width of the cylinder 2. Depending upon the press, centrifugal force alone can maintain contact between the cylinder 2 and plates. Alternatively, when included, the lockup assembly 18 facilitates uniform plate/cylinder contact. That is, upon tightening the lockup assembly 18, each plate is drawn and restrained to the outer cylinder surface 12 in orthogonal alignment to the rotational axis of the cylinder and in lateral alignment to each adjacent plate to rotate with the cylinder 2 without lateral movement. Depending upon the substrate material used to form the plate, whether it be a thin walled metal or a polyester film and the particular press being used, different lockup assemblies may be used with different presses. Such assemblies are well known and many styles and sizes can be obtained from various vendors.

Depending upon a particular printing run, the multiple printing plates 4, 6, 8 and 10 are typically secured to the cylinder 2 in rotational relation to a single web of paper stock 26. FIG. 1 depicts a direct or "flexo" printing assembly and wherein the paper 26 is directly mounted in tangential contact with the cylinder 2. Alternatively, offset printing assemblies print the images on an intermediate blanket cylinder which contacts the paper. Once printed, the printed paper stock 26 is passed through appropriate slitting, trimming and shearing stations (not shown) to reduce the web 26 to desired widths of printed matter. The trimmed selvage edges 30 are discarded.

The shape of the channel 16 and the leading and trailing cylinder edges 15 and 17, when viewed end-on, may vary from press to press. Similarly the shape and location of the plate registration pins 14 may vary. Plate alignment to the cylinder 2, however, is dependent on the relative positional accuracy of registration notches and the matching bends 19 formed in the plates and the corresponding alignment of the plate images thereto. It is critical that the plates rotate in orthogonal alignment to the rotational axis of the cylinder over the full cylinder rotation and from cylinder to cylinder of a multi-cylinder press, such as a multi-color press, or else the sequentially printed color images will appear blurred and misaligned.

As noted, plate misalignment is to be avoided. The penalty is having a customer reject a press run or to incur extensive lost time to re set the alignment of the plates to the press. Preferably, therefore, the image of each plate is longitudinally aligned to the longitudinal plate edge and the edges of each plate are orthogonally aligned to the cylinder and in parallel relation to each other. While conceptually simple, tolerance errors in the forming of each plate and the subsequent alignment to the press cylinders can compound to create difficulties in practice.

The current state-of-the-art is to separately prepare each of the printing plates 4, 6, 8 and 10 independent of each other plate. That is, a single piece of plate stock is typically reduced to size to provide a number of plate stock pieces. The size reduction is achieved with a shear that cuts the stock to length by removing a tail edge or trailing portion of the stock, across the full width of the stock. Each plate, unless a multi-plate imaging step is performed, is then separately sheared from the cut stock.

Each plate is next individually processed in a punch operation which produces a plurality of apertures which are punched to align the plates with photo imaging equipment used to transfer a printing image onto the plate stock. Appropriate notches are also cut into the edge of ones of the plates to align with the cylinder registration pins 14. Once imaged, each plate is separately aligned in bending equipment to form a bend in the leading edge of each plate which is compatible with the cylinder nose 15.

If multiple images are printed onto the plate stock, before cutting the stock to width, notches are punched in alignment with the edges of the images. Slitting equipment is aligned to the notches to longitudinally cut the stock and create several printing plates. Alternatively, a shear may be used to cut the longitudinal edges.

Throughout the foregoing process, and even if multiple plates are simultaneously imaged onto the plate stock, numerous errors accrue from inherent tolerances of each step and from the separate handling and processing of each plate. The compounding of such errors can on occasion create difficulties with respect to the quality of the printed images, press setup, sizing of the paper stock and/or waste. As important as press run costs is the inventory cost to the plate maker to stock large numbers of different sizes of plate stock material and the time and labor necessary to process each printing plate.

Figure 3:
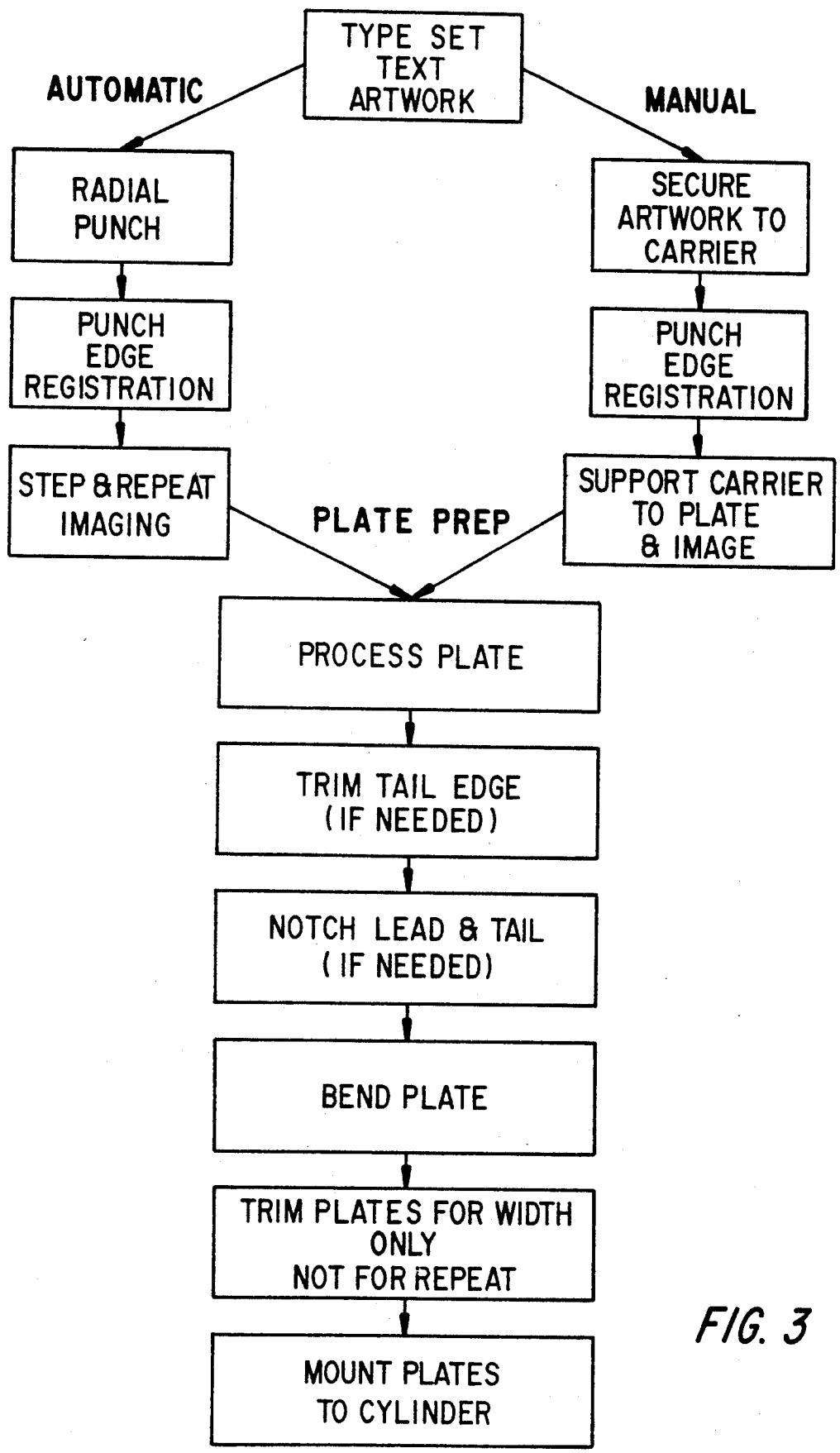
FIG. 3 is a process flow diagram of the improved plate preparation process of the present invention including simultaneous registration of the plates to the plate imaging means and to the press cylinder.

Referring therefore to FIGS. 3 and 4, Applicant has developed an improved process for creating printing plates with improved alignment tolerances from plate to plate. Applicant's process not only aligns multiple photographed plate images to a single piece of plate stock, but also simultaneously indexes each image to registration means or indices provided at each prepared plate which correspond to the nose 15 and registration pins 14 at the press cylinder 2.

Specifically, each of the multiple images are indexed to a plurality of apertures or notches and at least one bent peripheral edge 19 of the plate stock, shaped to mate with the cylinder nose 15. Prior to bending the plate stock, additional index registrations or notches are formed to facilitate dicing or slitting the imaged plate stock, after forming the cylinder registration bends. Tolerance errors are thereby minimized not only from plate to plate, but also across multiple plates intended for single print runs.

FIG. 3 depicts an overview of the process with respect to alternative imaging techniques. That is, images may be transferred to the plate stock in a manual layup process, where prepared text and artwork are taped to a carrier which is imaged onto the plate stock. Alternatively, the text and artwork can be electronically processed and imaged in a step and-repeat fashion onto the plate stock. The plate stock is then trimmed, marked for slitting and bent to fit the nose 15, prior to slitting the plates and affixing to the cylinder.

Figure 4A:
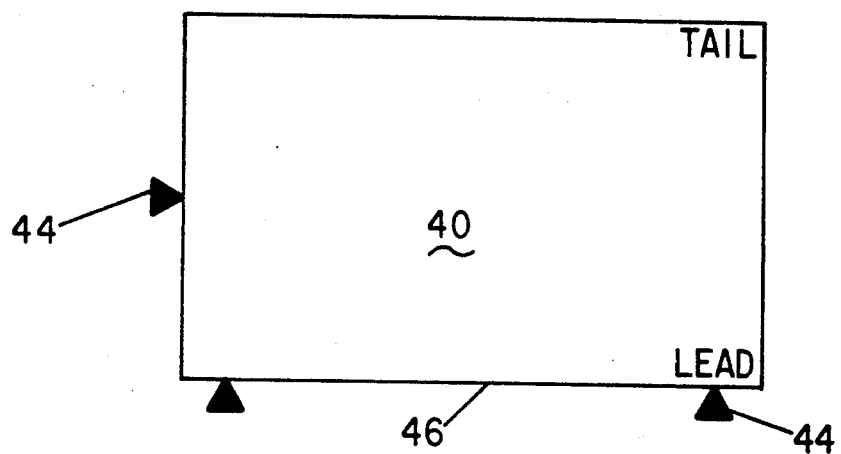
FIGS. 4a, 4b, 4c, 4d, 4e, and 4f are perspective and elevation drawings of the sequential plate preparation steps of the process of FIG. 3.
Figure 4B:
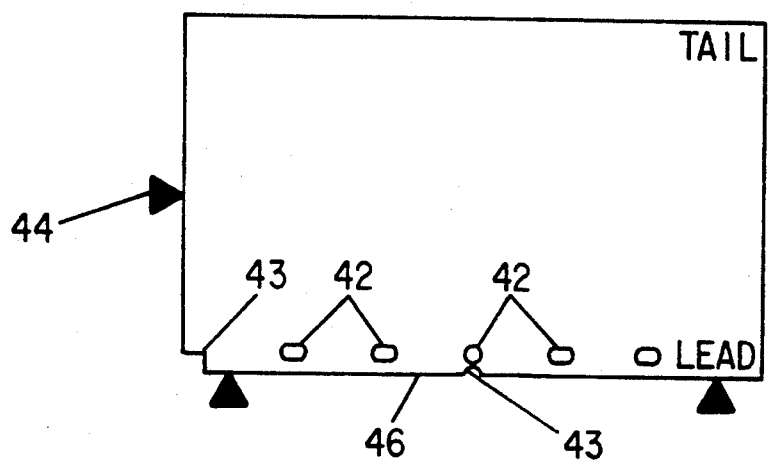

With additional detail and from FIGS. 4a and 4b, the plate preparation process is initiated by selecting an appropriate size of plate stock material 40 to accommodate the width of the images to be printed and the circumference of the particular printing press cylinder 2. The material may comprise a sheet of aluminum or polyester resin. The material is inserted into an appropriate punch, reference FIG. 4b, and image registration holes 42 and cylinder registration notches 43 are cut into the material. Applicant particularly recommends manual and semi-automatic electronic-pneumatic punches, sold by the present Assignee, Ternes Register System, St. Paul, Minn.

In particular, upon inserting the plate stock 40, the stock 40 is indexed against three electronic indexing stops 44, which are shown as darkened triangular regions. The stops 44 align the plate stock 40 to an included punch head (not shown). Various shaped holes 42 and/or notches 43 are next determined at various positions which align with the subsequent imaging equipment and the provided registration pins 14 at the cylinder 2. Most typically, the punched holes 42 comprise circular and/or elongated holes which are formed along or adjacent a leading peripheral edge 46 of the stock 40. The notches 43 may be rectangular, square or provide arcuate edges and are positioned as necessary to mate with the registration pins 14. Typically, the notches are positioned along the leading edge at the corner or center of each plate.

The resultant holes 42 serve to align the plate stock 40 relative to the step and repeat imaging equipment or a vacuum frame or carrier support, such as the present Assignee's Image Control Board. In either case, the plate stock 40 is supported relative to equipment that reproduces the print images 48, 50, 52 and 54 onto the plate stock 40, reference FIG. 4c. For the sake of clarity, the images are depicted only at FIG. 4c. One or more scrap pieces 55 of plate stock may also be defined.

Figure 4C:
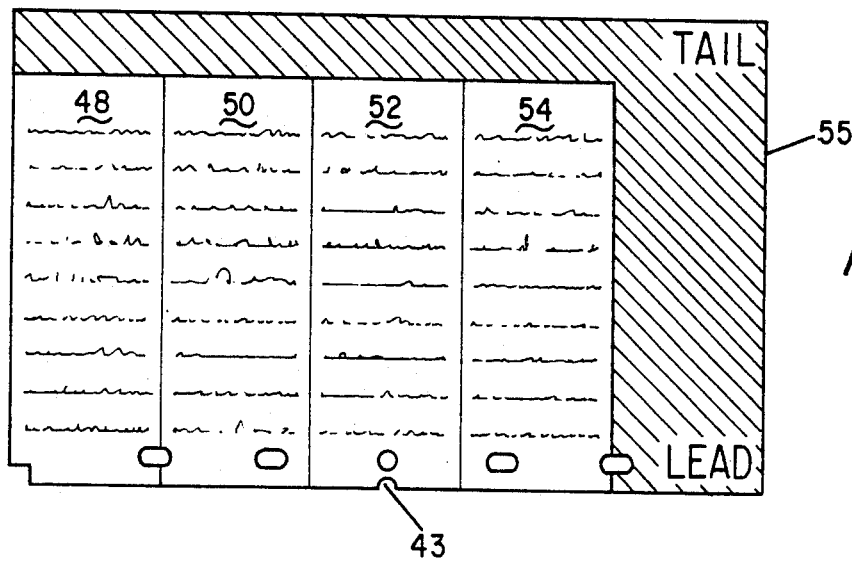

Preferably, a multiple image layout is effected in a fashion such as shown in FIG. 4c. Although, it is to be appreciated the images may be separated from one another, as opposed to being mounted in side-to-side relation.

Figure 4D:
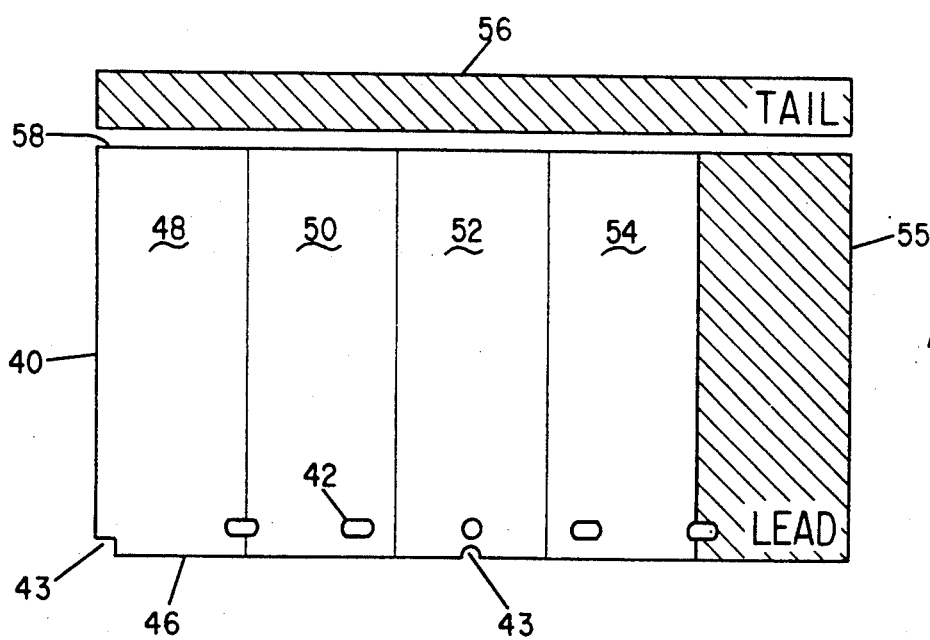

With reference to FIG. 4d, the imaged plate stock 40 is next passed though a shear (not shown) to separate the tail piece 56 from the stock 40. It is not necessary that the trailing or tail cut edge 58 be perfectly parallel to the leading edge 46.

Traditionally and prior to imaging the plate 40, the tail piece 56 is severed and the separate plates are cut into strips. The separate strips are punched and individually located to the imaging equipment, registration pins and the subsequent equipment described below for bending the leading and/or trailing edges to fit the cylinder. These steps and repetitive re-alignments are avoided with the present process.

Figure 4E:
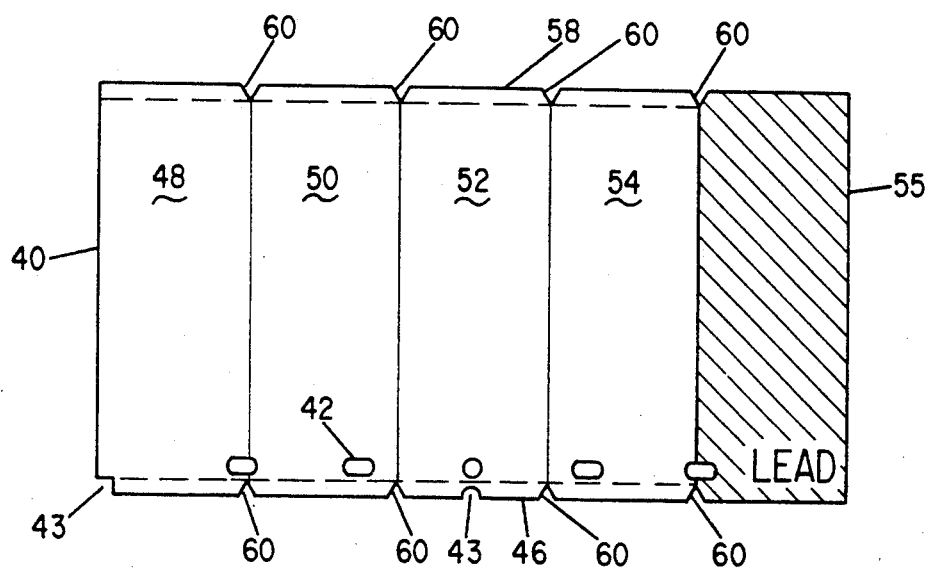

With attention to FIG. 4e, the partially sized and imaged plate stock 40 is next aligned with appropriate notching equipment (not shown) which punches V-shaped notches 60 in alignment with the longitudinal edge of the individual plate images 48, 50, 52, 54. Although V-shaped notches 60 are shown, it is to be appreciated any of a variety of other shapes can be used which suitably index the beginning and ending points for a subsequent slitting operation. For example, a U-shaped, a modified U/V shape or square cut shapes, among other varieties of notch configurations could be equally employed. Any provided notch 60 must however permit slitter access to the prepared plate stock, once the lead and tail edges 46, 58 are bent, to obtain the desired slitting, without damaging the adjacent plates or images.

Figure 4F:
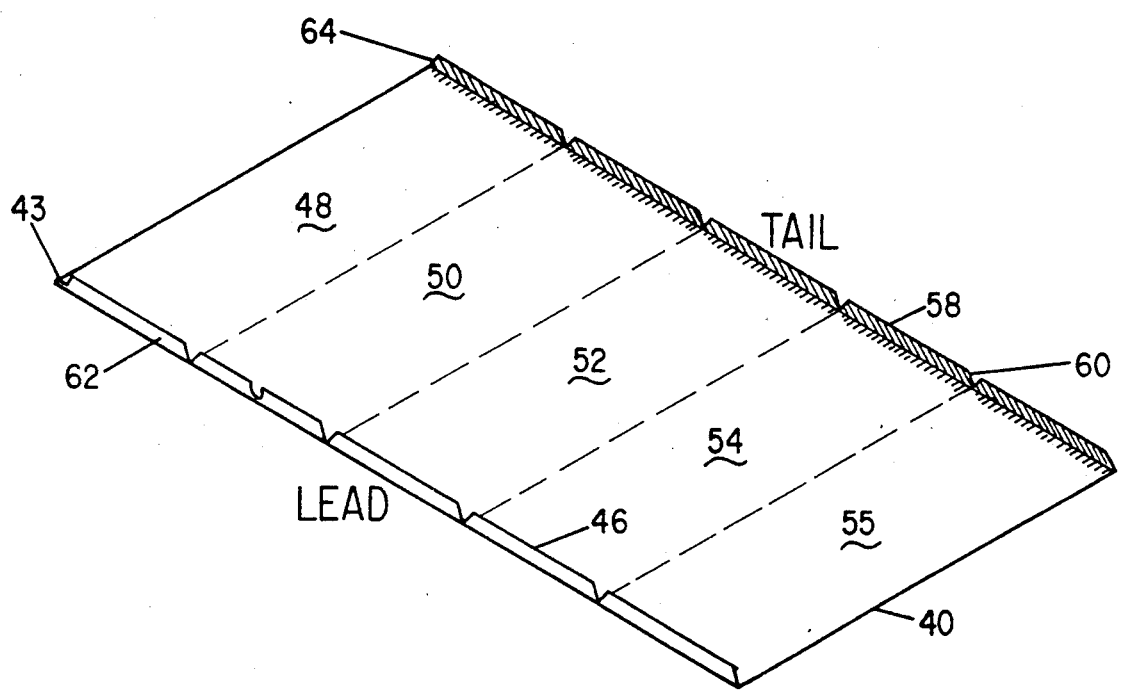

Once the plate stock 40 has been printed and notched and with attention to FIG. 4f, the plate 40 is aligned with respect to an appropriate bender, such as the present Assignee's electronic-pneumatic or hydraulic bender. Appropriate edge bends 62 and 64 are made across the full width of the plate stock to mate with the cylinder. The operation and types of bends obtainable with such equipment are well known in the art.

Once the leading and/or trailing edges 46 and 58 of the imaged plate stock 40 are bent to form, the stock is fed through various available slitting equipment. Such equipment cooperates with the notches 60 to separate each printing plate 48, 50, 52 and 54 from its neighbor and the scrap piece 55. Four plates are formed, along with the scrap piece 55, which is discarded.

Whereas the prior art plates exhibited a similar configuration, it is be appreciated that alignment of the plates relative to the press cylinder 2 was subject to the compounded errors which occurred with the separate handling of each of the imaged plates. In contrast, the plates 48, 50, 52 and 54 are simultaneously aligned relative to the registration punch equipment, the plate imaging equipment and the edge forming equipment, as well as the slitting equipment. Thus, upon separating each plate 48, 50, 52 and 54 from the stock 40, one is assured that all plates are formed in alignment with each other and relative to the alignment characteristics of the cylinder 2. This alignment is reproducible upon press setup, whether the plates are mounted immediately adjacent to an original neighbor, are spaced apart from one another or are positioned in a different sequence on different cylinders.

While the invention has been described with respect to its presently preferred methodology and various improvements and modifications thereto, it is to be appreciated still other variations may be suggested to those skilled in the art. Accordingly, it is contemplated that the invention should be interpreted to include all equivalent methods within the scope of the following presented claims.

What is claimed is:

1. A method for preparing printing plates comprising the steps of:
   a) forming a plurality of registration indices along at least one peripheral edge of a section of printing plate stock, wherein at least one of said registration indices corresponds to a mating index of a printing press cylinder;
   b) aligning at least one of said registration indices with imaging means and transferring a plurality of print images to said plate stock in predefined longitudinal and lateral relation to each other;
   c) forming a plurality of shear indices in said plate stock, each of said shear indices being aligned with a longitudinal edge of a respective transferred image;
   d) aligning said plate stock to bending means and being a leading lateral edge of said plate stock; and
   e) separating the bent plate stock at said shear indices into a plurality of printing plates, each printing plate containing a transferred print image and a bend, whereby each bend is alignable with retainer means provided on said printing press cylinder.

2. A method as set forth in claim 1 including a step wherein a tail portion of said plate stock opposite to the leading lateral edge is removed subsequent to the transfer of the print images, whereby a trailing lateral edge and the length of each of said plurality of printing plates is defined.

3. A method as set forth in claim 1 including a step of bending a trailing lateral edge of the plate stock.

4. A method as set forth in claim 1 wherein each of said shear indices comprises a V-shaped notch formed along each of the leading lateral edge and a trailing lateral edge of said plate stock and opposed pairs of which notches are coincident with a longitudinal edge of each of said print images.

5. A method as set forth in claim 1, wherein said retainer means comprises a transverse channel in said printing press cylinder and further including a step wherein the bent leading edge of each printing plate is coupled to said transverse channel.

6. A method as set forth in claim 1 wherein said print images are transferred in a step-and-repeat fashion.

7. A method as set forth in claim 1 wherein said print images are simultaneously and photographically transferred to said plate stock.

8. A method as set forth in claim 2 wherein the trailing lateral edge is in parallel alignment with the leading lateral edge.

9. A method as set forth in claim 1 wherein said bending means forms an acute angular bend at the leading edge of said plate stock.

10. A method for preparing printing plates comprising the steps of:
   a) forming a plurality of registration indices along at least one peripheral edge of a section of printing plate stock;
   b) aligning at least one of said registration indices with imaging means and transferring a plurality of print images to said plate stock in predefined longitudinal and lateral relation to each other;
   c) forming a plurality of shear indices in said plate stock, each of said shear indices being aligned with a longitudinal edge of a respective transferred image, wherein each of said shear indices comprises a V-shaped notch formed along each of a leading lateral edge and a trailing lateral edge of said plate stock and opposed pairs of which notches are coincident with a longitudinal edge of each of the transferred print images;
   d) aligning said plate stock to bending means and bending the leading lateral edge of said plate stock; and
   e) separating the bent plate stock at said shear indices into a plurality of printing plates, each printing plate containing a transferred print image and a bend, whereby each bend is alignable with retainer means provided on a printing press cylinder.

11. A method for preparing printing plates comprising the steps of:
   forming a plurality of registration indices along a leading lateral edge of a section of printing plate stock, wherein certain ones of said registration indices correspond to mating registration pins of a printing press cylinder;
   b) aligning at least one of said registration indices with imaging means and transferring a plurality of print images to said plate stock in predefined longitudinal and lateral relation to each other;
   c) forming a plurality of shear indices in said plate stock, each of said shear indices being aligned with a longitudinal edge of a respective transferred image, wherein each of said shear indices comprises a V-shaped notch formed along each of the leading lateral edge and a trailing lateral edge of said plate stock and opposed pairs of which notches are coincident with a longitudinal edge of each of the transferred images;
   d) aligning said plate stock to bending means and bending the leading lateral edge and the trailing lateral edge of said plate stock; and
   e) separating the bent plate stock at said shear indices into a plurality of printing plates, each printing plate containing a transferred print image and a pair of bends, whereby each bend is alignable with a transverse channel provided in said printing press cylinder.

12. A method for preparing printing plates comprising the steps of:
   a) forming a plurality of registration indices along at least one peripheral edge of a section of printing plate stock;
   b) aligning at least one of said registration indices with imaging means and transferring a plurality of print images to said plate stock in predefined longitudinal and lateral relation to each other;
   c) aligning said plate stock to bending means and bending a leading lateral edge of said plate stock; and
   d) separating said plate stock into a plurality of printing plates, each printing plate containing a transferred print image and a bend, whereby each bend is alignable with retainer means provided on said printing press cylinder.

* * * * *